(12) United States Patent
Meyer et al.

(10) Patent No.: US 7,715,264 B2
(45) Date of Patent: May 11, 2010

(54) METHOD AND APPARATUS FOR SELECTIVELY DISABLING TERMINATION CIRCUITRY

(75) Inventors: Peter Meyer, Apex, NC (US); Nicholas Heath, Apex, NC (US)

(73) Assignee: Qimonda North America Corp., Cary, NC (US)

( * ) Notice: Subject to any disclaimer, the term of this patent is extended or adjusted under 35 U.S.C. 154(b) by 154 days.

(21) Appl. No.: 12/145,146

(22) Filed: Jun. 24, 2008

(65) Prior Publication Data

US 2009/0316511 A1    Dec. 24, 2009

(51) Int. Cl.
    *G11C 7/00*    (2006.01)
(52) U.S. Cl. .................. 365/222; 365/195; 365/227
(58) Field of Classification Search .......... 365/195
    See application file for complete search history.

(56) References Cited

U.S. PATENT DOCUMENTS 5,831,467 A    11/1998    Leung et al.
6,031,782 A *   2/2000    Kobashi et al. ............. 365/228
7,177,224 B2    2/2007    Johnson
7,215,582 B2    5/2007    Johnson
2007/0028060 A1  2/2007   Ware et al.

\* cited by examiner

*Primary Examiner*—Tan T. Nguyen
(74) *Attorney, Agent, or Firm*—Coats & Bennett, P.L.L.C.

(57) ABSTRACT

In one embodiment, an electronic device comprises control circuitry. The control circuitry disables termination circuitry coupled to one or more input/output (I/O) signals of the electronic device during at least a portion of a relatively low frequency operation which causes insubstantial signal reflections at the I/O signals. The control circuitry re-enables the termination circuitry prior to the electronic device performing a relatively high frequency operation after completion of the low frequency operation, the high frequency operation causing substantial signal reflections at the I/O signals. The electronic device is a memory device in one embodiment. This way, the termination circuitry may be disabled during at least a portion of a refresh operation performed by the memory device and re-enabled prior to the memory device resuming normal operation (i.e., reads and writes) after completion of the refresh operation.

25 Claims, 6 Drawing Sheets

METHOD AND APPARATUS FOR SELECTIVELY DISABLING TERMINATION CIRCUITRY

BACKGROUND OF THE INVENTION

Many types of electronic devices such as microprocessors, digital signal processors, memory devices, application-specific integrated circuits (ASICs) and the like typically terminate their input/output (I/O) signals to reduce signal reflections which occur at high frequencies. Reducing signal reflections reduces interference. An I/O signal is typically terminated by coupling the signal to a termination circuit such as a terminating resistor, which in turn is coupled to a termination voltage node. The termination circuit provides a termination voltage to the I/O signal which helps to reduce signal reflections at high frequencies. However, some electronic devices perform both high and low frequency operations where substantial signal reflections occur only at high frequencies and not low frequencies.

Take, for example, a conventional DRAM (dynamic random access memory) device. During normal operation such as reads and writes, its I/O signals operate at high frequencies to boost performance. Termination circuitry coupled to the I/O signals reduces interference caused by signal reflections which arise at high frequencies. DRAM devices also periodically perform a refresh operation to prevent data loss. The I/O signals of the DRAM device do not operate at high frequencies during a refresh operation. Instead, the I/O signals are typically held at a fixed voltage level while the refresh operation is performed.

One type of DRAM refresh operation is a self-refresh where the DRAM device is externally instructed to perform a refresh. For example, a GDDRx SDRAM (graphics double-data-rate synchronous dynamic random access memory, version x) can be instructed to perform a self-refresh operation by driving its chip select (CS), row address strobe (RAS), column address strobe (CAS) and clock enable (CKE) input signals low and its write enable (WE) input signal high at the rising edge of the clock input. However, the CKE input signal is typically terminated at a high voltage level. This causes static current to flow between the termination node and CKE input signal during the refresh operation because the CKE signal is held at a voltage level different than its termination voltage. For some DRAM devices, the CKE input signal draws approximately half of the total current consumed by the DRAM device during a self-refresh operation due to the termination-to-signal voltage mismatch. Generally, any I/O signal of an electronic device having a termination-to-signal voltage mismatch during a low-frequency operation (i.e., an operation which does not cause substantial signal reflections) unnecessarily draws current during the low frequency operation.

SUMMARY OF THE INVENTION

In one embodiment, control circuitry disables termination circuitry coupled to one or more input/output (I/O) signals of an electronic device during at least a portion of a relatively low frequency operation which causes insubstantial signal reflections at the I/O signals. The control circuitry re-enables the termination circuitry prior to the electronic device performing a relatively high frequency operation after completion of the low frequency operation, the high frequency operation causing substantial signal reflections at the I/O signals. The electronic device is a memory device in one embodiment. This way, the termination circuitry may be disabled during at least a portion of a refresh operation performed by the memory device and re-enabled prior to the memory device resuming normal operation (i.e., reads and writes) after completion of the refresh operation.

Of course, the present invention is not limited to the above features and advantages. Those skilled in the art will recognize additional features and advantages upon reading the following detailed description, and upon viewing the accompanying drawings.

DETAILED DESCRIPTION OF THE INVENTION

Figure 1:
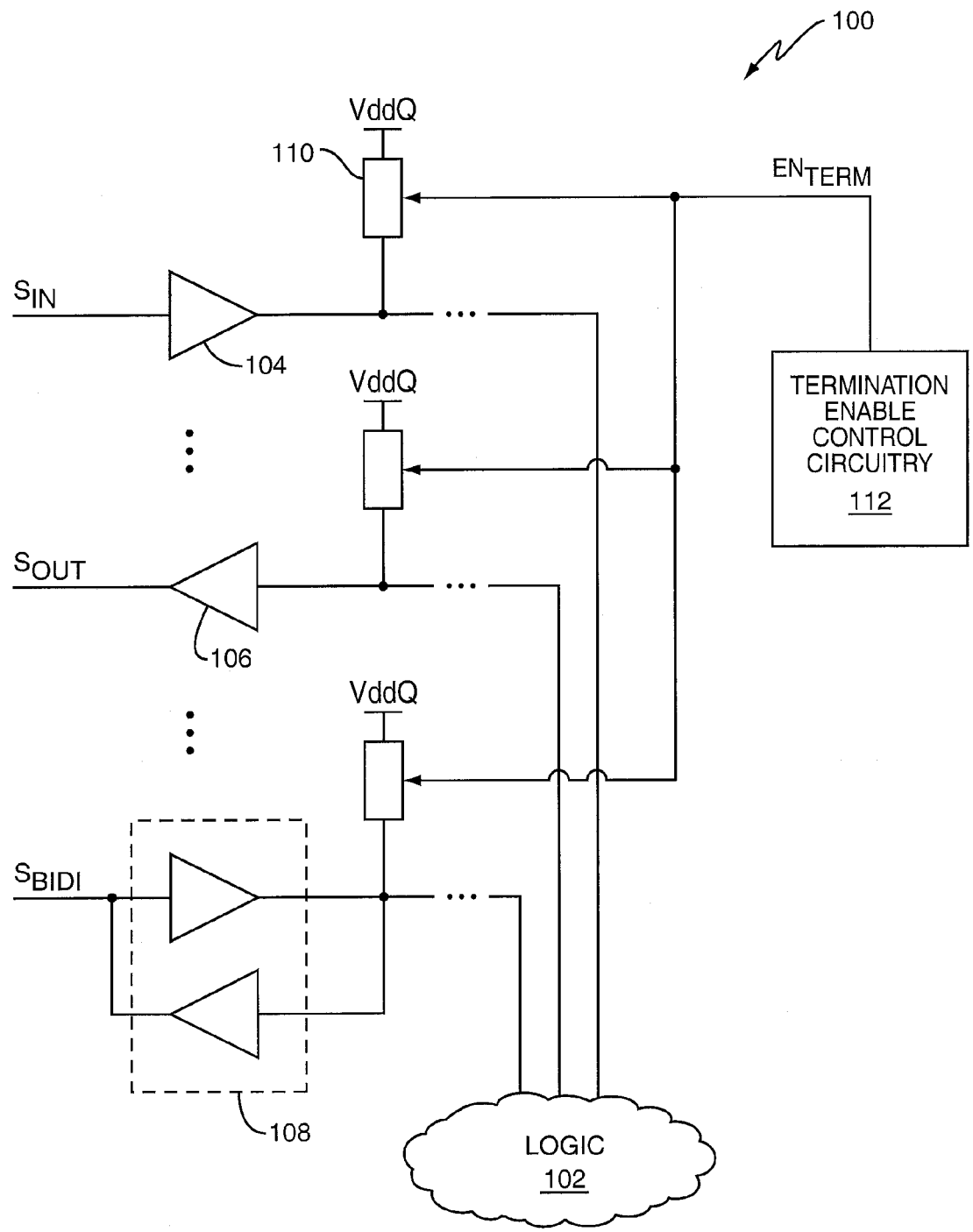
FIG. 1 is a block diagram of an embodiment of an electronic device including termination enable control circuitry.

FIG. 1 illustrates an embodiment of an electronic device 100 such as a microprocessor, digital signal processor, memory device, ASIC or the like. Logic 102 included in the electronic device 100 performs one or more functions for which the device 100 is designed. Accordingly, the logic 102 may include analog, digital and/or mixed signal logic, registers, memory arrays, fuses, arithmetic logic units, floating point units, integer units, buses, etc. or any combination thereof. The device 100 also has a plurality of I/O signals for carrying data, address and/or control information to and from the device 100. The term "I/O signal" as used herein means any data, address and/or control signal input ($S_{IN}$) to the device 100 at an input buffer 104, output ($S_{OUT}$) from the device 100 at an output buffer 106 or both ($S_{BIDI}$) at a bi-directional buffer 108.

Termination circuitry 110 couples the I/O signals to a termination voltage node (VddQ). Signal reflections which arise at the I/O signals during relatively high frequency operation are reduced by coupling the I/O signals to the termination voltage node, thus reducing interference. The electronic device 100 also performs one or more relatively low frequency operations where signal reflections at the I/O signals are insubstantial and cause little or no interference. In one embodiment, the low frequency operation is a memory refresh operation. In another embodiment, the device 100 enters a low-power or sleep mode. In yet another embodiment, the device 100 performs a self-test routine such as Array-Built-In-Self-Test (ABIST), Logic-Built-In-Self-Test (LBIST), or a scan-based routine such as boundary scan, etc. Regardless, the device 100 may perform any type of low frequency operation where the I/O signal levels do not change rapidly enough to induce significant interference-causing reflections.

Termination enable control circuitry 112 included in the electronic device 100 disables the termination circuitry 110 coupled to one or more of the I/O signals during at least a portion of the low frequency operations performed by the electronic device 100, e.g., as illustrated by Step 200 of FIG.

2. The termination circuitry 110 can be disabled during low frequency operation without causing appreciable interference because only insubstantial signal reflections arise at the I/O signals during low frequency operation. This way, power consumption is reduced without sacrificing signal quality. In one embodiment, the control circuitry 112 disables the termination circuitry 110 coupled to each I/O signal driven to a voltage level during low frequency operation which is different than the termination voltage VddQ provided by the termination circuitry 110. For example, the termination circuitry 110 coupled to the I/O signals which are driven to a low or midpoint voltage level can be disabled during low frequency operation when the termination voltage is at a high level. This minimizes static current flow at the I/O signals having a termination-to-signal voltage mismatch, reducing power consumption.

Figure 2:
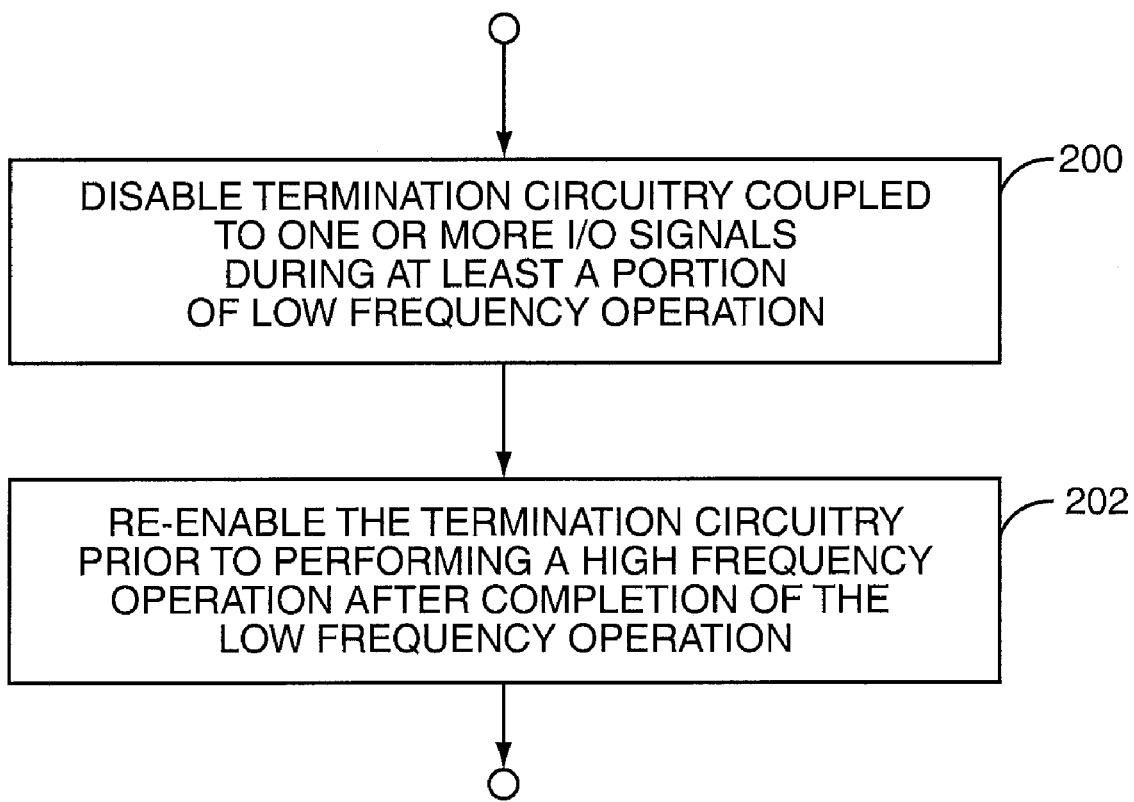
FIG. 2 is a logic flow diagram of an embodiment of program logic for selectively disabling termination circuitry included in an electronic device.

The control circuitry 112 subsequently re-enables the disabled termination circuitry 110 prior to the electronic device 100 performing a high frequency operation after completion of the low frequency operation, e.g., as illustrated by Step 202 of FIG. 2. Accordingly, the termination circuitry 110 is re-enabled before substantial signal reflections arise at the I/O signals. The control circuitry 112 may directly monitor one or more of the I/O signals to determine when the device 100 is expected to enter and exit low frequency operation. In another embodiment, one function of the logic 102 included in the device 100 is to monitor device activity and notify the control circuitry 112 when the device 100 is expected to enter and exit low frequency operation.

Either way, the termination enable control circuitry 112 activates an enable signal ($EN_{TERM}$) for enabling the termination circuitry 110 and deactivates the enable signal for disabling the termination circuitry 110 coupled to one or more of the I/O signals. In one embodiment, the enable signal is globally applied to all I/O signals for which selective disablement of the termination circuitry is desired. This way, the termination circuitry 110 coupled to all desired I/O signals is controlled by the same enable signal. In another embodiment, individual ones of the termination circuits 110 or groups of termination circuits 110 are controlled by different enable signals. Regardless, the selective termination disablement embodiments described herein reduce power consumption by the electronic device 100 during low frequency operation.

Figure 3:
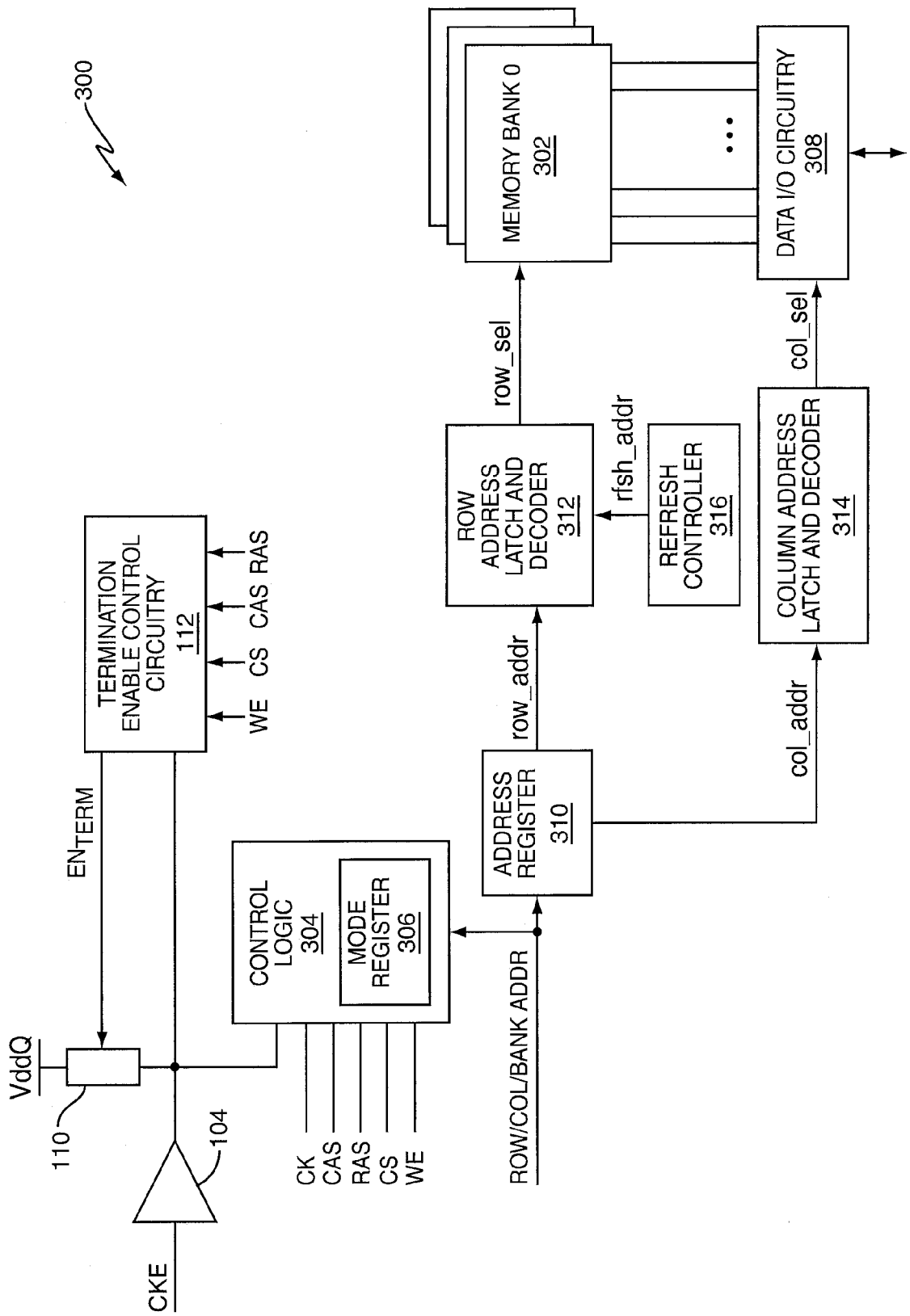
FIG. 3 is a block diagram of an embodiment of a memory device including termination enable control circuitry.

FIG. 3 illustrates an embodiment of a memory device 300 including the termination enable control circuitry 112. In one embodiment, the memory device 300 is a GDDRx SDRAM. In another embodiment, the memory device 300 is a DDRx SDRAM (double-data-rate synchronous dynamic random access memory, version x). In still other embodiments, the memory device 300 is yet a different type of DRAM. Regardless, the memory device 300 has one or more banks of memory arrays 302 for storing data. Each memory array bank 302 includes a plurality of memory cells (not shown) having a storage element located at the intersection of a word line (i.e., row) and bit line (i.e., column). Control logic 304 included in the memory device 300 receives input control signals such as the CKE, CAS, RAS, CS, and WE signals in synchronization with a system clock CK.

The control logic 304 decodes the input control signals into one or more commands. Each decoded command instructs the memory device 300 to perform a particular operation. For example, the memory device 300 is instructed to perform a write operation when CS, WE, and CAS are active (logic low) and RAS is inactive (logic high). A mode register 306 included in or associated with the control logic 304 defines the specific mode of operation for the memory device 300. For example, the mode register 306 may define burst length, burst type (e.g., interleaved or sequential), one or more memory access latencies such as cas latency, and/or operating mode of the memory device 300. The mode register 306 is programmed in response to a corresponding command and retains its settings until re-programmed.

In response to a decoded command, the control logic 304 enables, disables, or otherwise controls various functions of the memory device 300 in order to execute particular commands. Data input/output (I/O) circuitry 308 samples, or captures, input data signals during write operations and drives output data signals during read operations. An address register 310 stores a row, column and bank address (ROW/COL/BANK ADDR) associated with a particular array location at which data is to be read from or written to during a normal memory operation, i.e., a non-refresh operation.

The row and column addresses are provided to row and column latch and decoder circuits 312, 314, respectively. Particularly, the address register 310 provides a row address (row_addr) to the row address latch and decoder circuit 312 for activating a corresponding word line (row_sel) in the memory array 302. The address register 310 also provides a column address (col_addr) to the column address latch and decoder circuit 314 for activating a corresponding bit line (col_sel) in the memory array 302. As such, a specific word and bit line of the memory array 302 can be selected, or activated, in response to an address associated with a particular command.

The data I/O circuitry 308 provides a data read/write gating mechanism by which data is either read from or written to the selected memory array location. This includes a plurality of sense amplifiers (not shown) and I/O gating circuits such as read latches and write drivers (not shown). The sense amplifiers and I/O gating circuits can be arranged in any suitable configuration such as local, sub-array, global or other shared or unshared configurations. The read latches provide data sampled by the sense amplifiers to the data I/O circuitry 308 for external transmission during a read operation. The write drivers provide data to the memory array 302 for storing the data during a write operation. The data I/O circuitry 308 enables specific I/O gating circuits associated with targeted memory cells during a particular operation.

The memory device 300 also has a refresh controller 316 for periodically refreshing data stored in the memory array 302 to prevent data loss. The refresh controller 316, as directed by the control logic 304, generates a refresh address (rfsh_addr) that determines which row in the memory array 302 is selected for refresh. The refresh controller 316 may perform either self or auto refreshes as is well known in the art. In one embodiment, the memory device 300 is externally instructed to perform a self refresh when input signals CS, RAS, CAS and CKE are driven low and WE is driven high at the rising edge of CK. In response, the control logic 304 instructs the refresh controller 316 to perform a self refresh.

Figure 4:
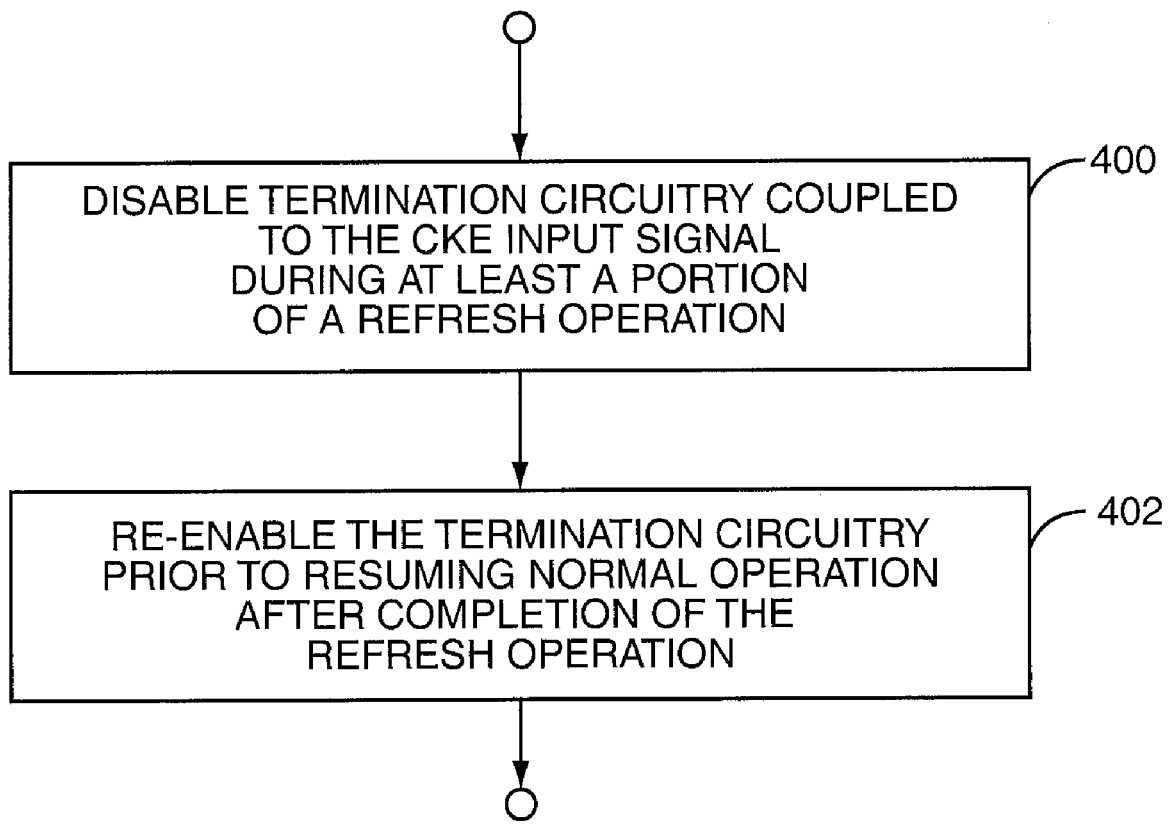
FIG. 4 is a logic flow diagram of an embodiment of program logic for selectively disabling termination circuitry included in a memory device.

The CKE input signal remains at a logic low level or a mid-level during the self refresh operation. However, the termination circuitry 110 coupled to the CKE signal provides a high termination voltage (VddQ). To prevent unnecessary static current draw during the refresh operation, the termination enable control circuitry 112 disables the termination circuitry 110 coupled to the CKE input signal, e.g., as illustrated by Step 400 of FIG. 4. This way, the direct path between the high termination voltage node VddQ and the lower-voltage CKE signal is essentially eliminated. Disabling the termination circuitry 110 coupled to the CKE signal during at least a portion of the refresh operation results in little or no signal interference because CKE is held at a fixed voltage level, thus causing little or no signal reflections. The termination circuitry 110 is re-enabled prior to resuming normal operation after completion of the refresh operation, e.g., as illustrated by Step 402 of FIG. 4. The CKE input signal is driven high to indicate that the memory device 300 is to exit the refresh operation and resume normal operation (i.e., non-refresh operations such as reads and writes). Several clock cycles elapse after the CKE input signal goes high before the memory device 300 can resume normal operation. This delay period provides the termination enable control circuitry 112 enough time to re-enable the termination circuitry 110 coupled to the CKE input signal before high-frequency operation resumes.

The termination circuitry 110 coupled to other I/O signals may also be disabled during the refresh operation. In one embodiment, the termination circuitry 110 coupled to each I/O signal driven to a voltage level during a refresh operation different than the termination voltage VddQ is disabled. The termination enable control circuitry 112 may directly monitor the input control signals CAS, RAS, WE, CS and CKE to determine when the memory device 300 is instructed to enter and exit refresh operations. Alternatively, the control logic 304 monitors the input control signals and instructs the termination enable control circuitry 112 when to enable and disable the termination circuitry 110. Either way, power consumption is reduced during refresh operations by disabling the termination circuitry 110 coupled to at least the CKE input signal.

Figure 5:
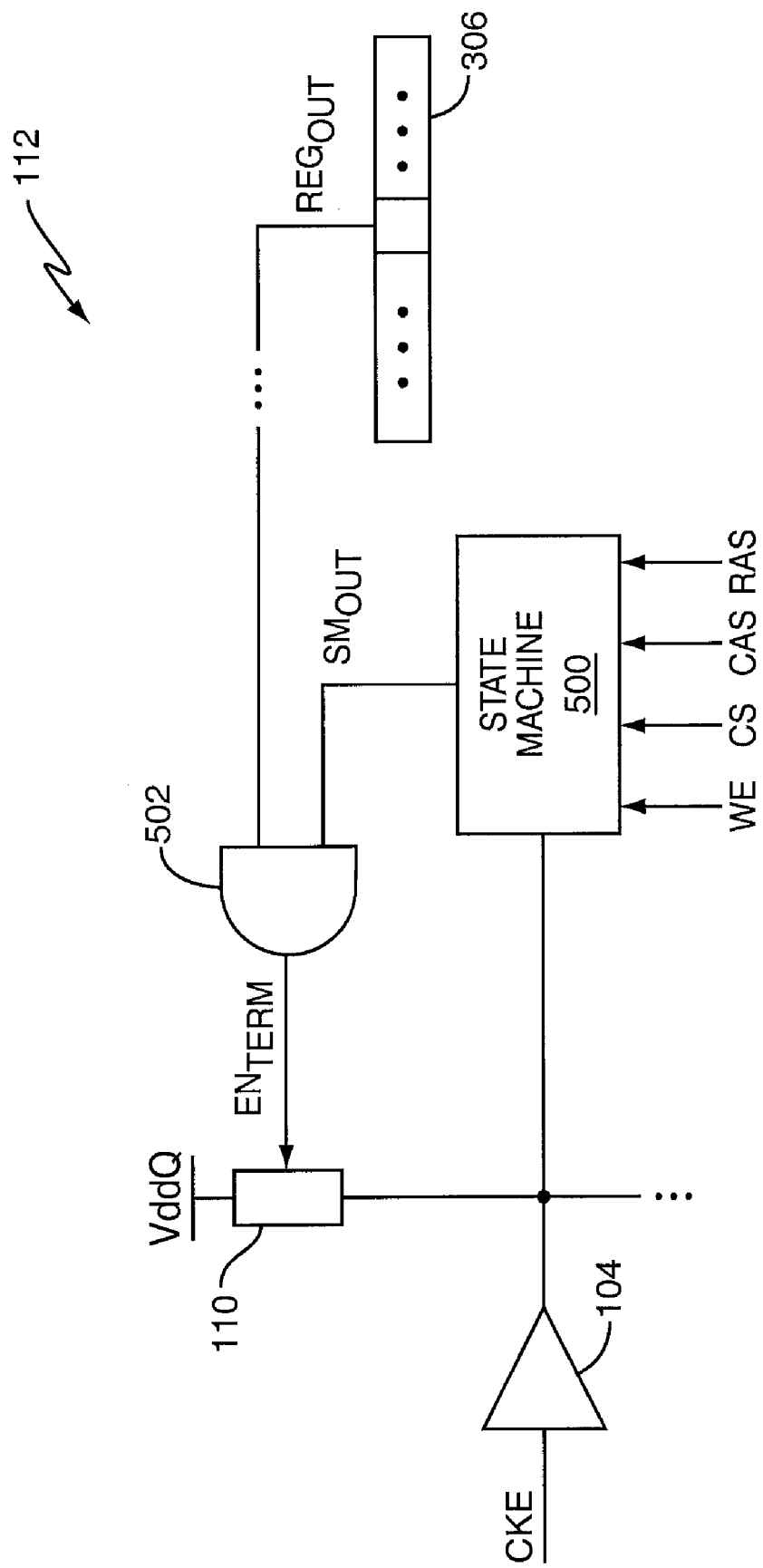
FIG. 5 is a block diagram of an embodiment of termination enable control circuitry.

FIG. 5 illustrates an embodiment of the termination enable control circuitry 112. According to this embodiment, the circuitry 112 includes a state machine 500 that activates and deactivates its output ($SM_{OUT}$) responsive to the state of the input control signals CAS, RAS, WE, CS and CKE. This way, the termination circuitry 110 coupled to at least the CKE input signal can be disabled during at least a portion of a refresh operation. The mode register 306 or other register included in the memory device 300 may have a global bit ($REG_{OUT}$) for indicating when all termination circuitry 110 included in the memory device 300 is to be enabled or disabled. A logic gate such as an AND logic gate 502 generates the termination enable signal ($EN_{TERM}$) based on the state of the global enable bit ($REG_{OUT}$) and state machine output ($SM_{OUT}$).

The termination enable signal is activated when both the global enable bit and state machine output indicate the termination circuitry 110 is to be enabled. Otherwise, the logic gate 502 deactivates the termination enable signal which causes the termination circuitry 110 to be disabled. This way, the termination circuitry 110 coupled to at least the CKE input signal can be disabled based on the state machine output $SM_{OUT}$ or when otherwise deemed appropriate based on the global enable bit $REG_{OUT}$.

Figure 6:
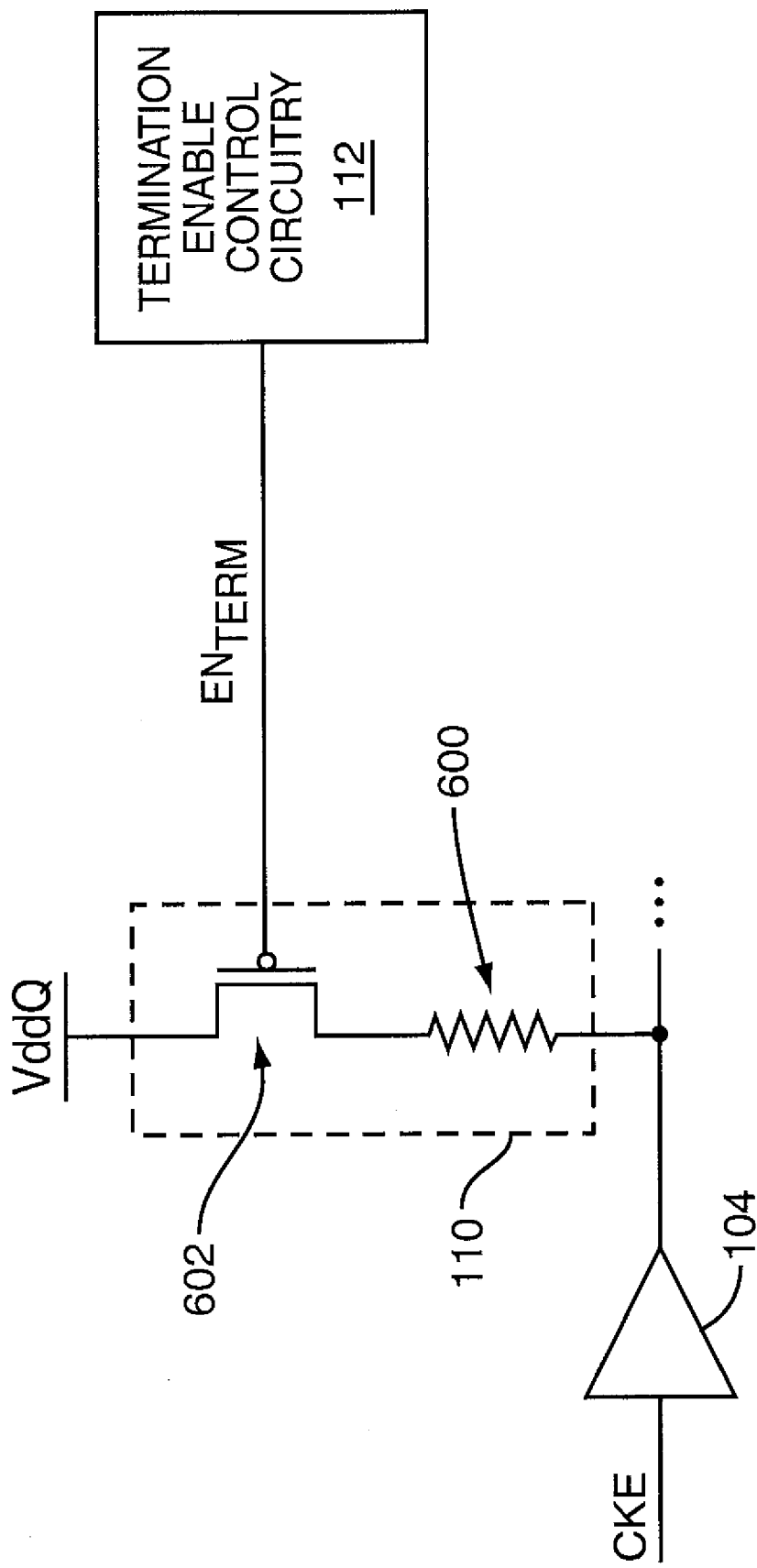
FIG. 6 is a block diagram of an embodiment of termination circuitry coupled to termination enable control circuitry.

FIG. 6 illustrates an embodiment of the termination circuitry 110 coupled to the CKE input signal of the memory device 300. According to this embodiment, the termination circuitry 110 comprises a terminating resistor 600 and a p-fet transistor 602. The terminating resistor 600 couples the CKE input signal to the termination voltage node VddQ when the p-fet transistor 602 is switched on. Thus, the termination enable control circuitry 112 drives the termination enable signal ($EN_{TERM}$) low to couple the CKE input signal to the termination voltage node VddQ during high frequency operation. Conversely, the termination enable signal is driven high to switch-off the p-fet 602 during low frequency operation such as during memory array refreshes, de-coupling the CKE input signal from the termination voltage node VddQ. Those skilled in the art will readily recognize that various other types of termination circuitry 110 may be employed and are within the scope of the various embodiments described herein.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of reducing power consumption by a memory device, comprising:
    disabling termination circuitry coupled to one or more input/output (I/O) signals of the memory device during at least a portion of a refresh operation performed by the memory device; and
    re-enabling the termination circuitry prior to the memory device resuming normal operation after completion of the refresh operation.

2. The method of claim 1, wherein disabling the termination circuitry comprises disabling termination circuitry coupled to a clock enable input signal of the memory device.

3. The method of claim 1, wherein disabling the termination circuitry comprises disabling termination circuitry coupled to one or more of the I/O signals driven to a voltage level during the refresh operation which is different than a termination voltage provided by the termination circuitry.

4. The method of claim 1, wherein disabling the termination circuitry comprises disabling one or more terminating resistors coupling respective ones of the I/O signals to a termination voltage node.

5. The method of claim 1, wherein disabling the termination circuitry comprises disabling the termination circuitry responsive to the memory device being instructed to perform the refresh operation.

6. The method of claim 1, wherein re-enabling the termination circuitry comprises re-enabling the termination circuitry responsive to the memory device being instructed to exit the refresh operation and resume normal operation.

7. A memory device comprising control circuitry operable to:
    disable termination circuitry coupled to one or more input/output (I/O) signals of the memory device during at least a portion of a refresh operation performed by the memory device; and
    re-enable the termination circuitry prior to the memory device resuming normal operation after completion of the refresh operation.

8. The memory device of claim 7, wherein the control circuitry is operable to disable termination circuitry coupled to a clock enable input signal of the memory device.

9. The memory device of claim 7, wherein the control circuitry is operable to disable termination circuitry coupled to one or more of the I/O signals driven to a voltage level during the refresh operation which is different than a termination voltage provided by the termination circuitry.

10. The memory device of claim 7, wherein the control circuitry is operable to disable one or more terminating resistors coupling respective ones of the I/O signals to a termination voltage node.

11. The memory device of claim 7, wherein the control circuitry is operable to disable the termination circuitry responsive to the memory device being instructed to perform the refresh operation.

12. The memory device of claim 7, wherein the control circuitry is operable to re-enable the termination circuitry responsive to the memory device being instructed to exit the refresh operation and resume normal operation.

13. The memory device of claim 7, wherein the control circuitry comprises a state machine.

14. The memory device of claim 13, wherein an output of the state machine is coupled to an input of a logic gate having another input coupled to one or more bits of a register included in the memory device, the logic gate operable to disable the termination circuitry responsive to the state of either the one or more registers bits or the state machine output.

15. A memory device comprising means for disabling termination circuitry coupled to one or more input/output signals of the memory device during at least a portion of a refresh operation performed by the memory device and re-enabling the termination circuitry prior to the memory device resuming normal operation after completion of the refresh operation.

16. A method of reducing power consumption by an electronic device, comprising:
    disabling termination circuitry coupled to one or more input/output (I/O) signals of the electronic device during at least a portion of a relatively low frequency operation which causes insubstantial signal reflections at the I/O signals; and
    re-enabling the termination circuitry prior to the electronic device performing a relatively high frequency operation after completion of the low frequency operation, the high frequency operation causing substantial signal reflections at the I/O signals.

17. The method of claim 16, wherein disabling the termination circuitry comprises disabling termination circuitry coupled to one or more of the I/O signals driven to a voltage level during the low frequency operation which is different than a termination voltage provided by the termination circuitry.

18. The method of claim 16, wherein disabling the termination circuitry comprises disabling one or more terminating resistors coupling respective ones of the I/O signals to a termination voltage node.

19. The method of claim 16, wherein disabling the termination circuitry comprises disabling the termination circuitry during at least a portion of a memory refresh operation performed by the electronic device.

20. The method of claim 16, wherein re-enabling the termination circuitry comprises re-enabling the termination circuitry prior to the electronic device performing a read or write memory operation after completion of a memory refresh operation.

21. An electronic device comprising control circuitry operable to:
    disable termination circuitry coupled to one or more input/output (I/O) signals of the electronic device during at least a portion of a relatively low frequency operation which causes insubstantial signal reflections at the I/O signals; and
    re-enable the termination circuitry prior to the electronic device performing a relatively high frequency operation after completion of the low frequency operation, the high frequency operation causing substantial signal reflections at the I/O signals.

22. The electronic device of claim 21, wherein the control circuitry is configured to disable termination circuitry coupled to one or more of the I/O signals driven to a voltage level during the low frequency operation which is different than a termination voltage provided by the termination circuitry.

23. The electronic device of claim 21, wherein the control circuitry is configured to disable one or more terminating resistors coupling respective ones of the I/O signals to a termination voltage node.

24. The electronic device of claim 21, wherein the control circuitry is configured to disable the termination circuitry during at least a portion of a memory refresh operation performed by the electronic device.

25. The electronic device of claim 21, wherein the control circuitry is configured to re-enable the termination circuitry prior to the electronic device performing a read or write memory operation after completion of a memory refresh operation.

* * * * *